United States Patent
Roberts et al.

(10) Patent No.: US 6,740,573 B2
(45) Date of Patent: May 25, 2004

(54) METHOD FOR FORMING AN INTEGRATED CIRCUIT INTERCONNECT USING A DUAL POLY PROCESS

(75) Inventors: Martin C. Roberts, Boise, ID (US); Sanh D. Tang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 08/390,714

(22) Filed: Feb. 17, 1995

(65) Prior Publication Data

US 2002/0025672 A1 Feb. 28, 2002

(51) Int. Cl.[7] .................... H01L 21/3205; H01L 21/44
(52) U.S. Cl. ............. 438/586; 438/633; 438/647; 438/672
(58) Field of Search ............. 438/304, 586, 438/592, 596, 630, 633, 637–655, 671–684, 657, 669, 634; 257/377, 381, 754–756, 764, 385

(56) References Cited

U.S. PATENT DOCUMENTS

| | | | | |
|---|---|---|---|---|
| 4,619,037 A | * | 10/1986 | Taguchi et al. | 438/637 |
| 4,874,719 A | * | 10/1989 | Kurosawa | 438/637 |
| 4,902,640 A | * | 2/1990 | Sachitano et al. | 438/202 |
| 4,908,324 A | | 3/1990 | Nihira et al. | 437/31 |
| 4,948,756 A | * | 8/1990 | Ueda | 438/622 |
| 4,968,645 A | * | 11/1990 | Baldi et al. | 438/655 |
| 5,149,665 A | | 9/1992 | Lee | 437/43 |
| 5,185,058 A | | 2/1993 | Cathey, Jr. | 156/656 |
| 5,219,793 A | * | 6/1993 | Cooper et al. | 438/595 |
| 5,243,220 A | | 9/1993 | Shibata et al. | 257/748 |
| 5,245,794 A | * | 9/1993 | Salugsugan | 451/10 |
| 5,320,981 A | | 6/1994 | Blalock | 437/195 |
| 5,324,672 A | * | 6/1994 | Anmo et al. | 438/366 |
| 5,416,736 A | | 5/1995 | Kosa et al. | 365/174 |
| 5,479,048 A | * | 12/1995 | Yallup et al. | 257/621 |
| 5,506,172 A | | 4/1996 | Tang | 437/189 |
| 5,541,429 A | | 7/1996 | Shibib | 257/329 |
| 5,563,098 A | | 10/1996 | Kuo et al. | 437/191 |
| 5,666,007 A | * | 9/1997 | Chung | 257/751 |
| 5,683,939 A | | 11/1997 | Schrantz et al. | 437/195 |
| 5,888,902 A | | 3/1999 | Jun | 438/637 |
| 5,923,584 A | | 7/1999 | Roberts et al. | 365/182 |

FOREIGN PATENT DOCUMENTS

| | | | |
|---|---|---|---|
| JP | 01160038 | 6/1989 | H01L/21/90 |
| JP | 03019342 | 1/1991 | H01L/21/3205 |

OTHER PUBLICATIONS

US 5,701,036, 12/1997, Tang (withdrawn)
Wolf, S., In: Silicon Processing for the VLSI Era—vol. 1: Process Technology, Lattice Press, Sunset Beach, CA, 175–177, (1986).

* cited by examiner

*Primary Examiner*—T. N. Quach
(74) *Attorney, Agent, or Firm*—Schwegman, Lundberg, Woessner & Kluth, P.A.

(57) ABSTRACT

A method for forming an electrical interconnect overlying a buried contact region of a substrate is characterized by a deposition of a first polycrystalline silicon layer and the patterning and etching of same to form a via. The via is formed in the first polycrystalline silicon layer to expose the substrate and a second polycrystalline silicon layer is formed in the via to contact the substrate. Portions of the second polycrystalline silicon layer overlying the first polycrystalline silicon layer are removed eliminating any horizontal interface between the two polycrystalline silicon layers. The first polycrystalline silicon layer remaining after the etch is then patterned to form an electrical interconnect.

50 Claims, 9 Drawing Sheets

METHOD FOR FORMING AN INTEGRATED CIRCUIT INTERCONNECT USING A DUAL POLY PROCESS

FIELD OF THE INVENTION

The invention is related to fabrication of a semiconductor, and more particularly to the fabrication of a polycrystalline silicon interconnect.

BACKGROUND ART

Figure 1A:
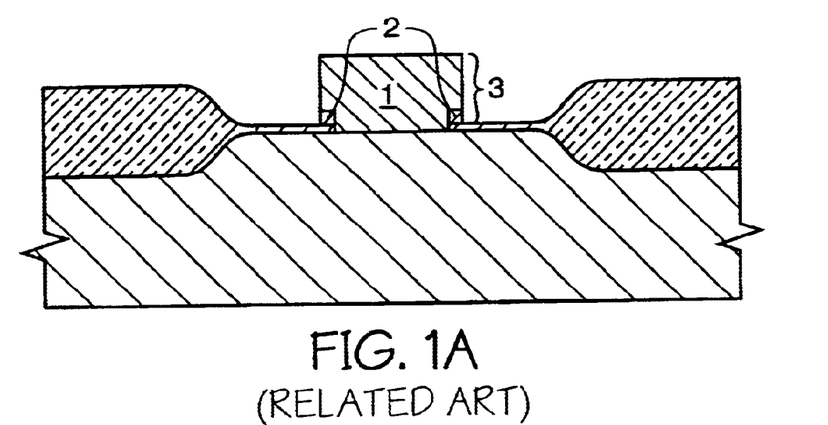
FIGS. 1A and 1B are cross-sectional views of electrical interconnects of the related art.

In some semiconductor buried contact applications upper 1 and lower 2 polycrystalline silicon layers form an electrical interconnect 3 to a substrate, see FIG. 1A. In the process for forming the electrical interconnect 3 polycrystalline silicon layer 1 is masked to define the electrical interconnect 3. Polysilicon 1, overlying polycrystalline silicon 2, and polycrystalline silicon 2 are etched to form the interconnect according to the mask. Typically a defect can occur along the horizontal interface between the upper 1 and lower 2 polycrystalline silicon layers. In one case the defect degrades the integrity of the electrical contact by preventing etching of the lower polycrystalline silicon layer in areas which are exposed during etching. This polycrystalline silicon which is not etched when intended can bridge between two poly interconnects thereby causing malfunctions in the part.

Figure 1B:
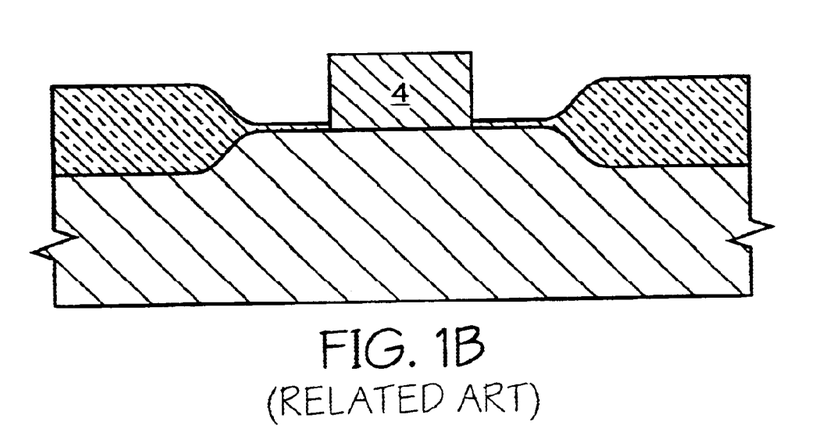

In one solution a single poly process is used, see FIG. 1B. In the single poly process a single layer of polycrystalline silicon is deposited and masked to form an electrical interconnect 4. However contamination problems occur at the poly/oxide interface during buried contact formation when the single poly process is used. In addition a required hydrofluoric acid etch thins the gate oxide layer creating a non uniform gate oxide.

In addition when patterning a polycrystalline silicon above a buried contact region, trenching of the substrate and exposure of the buried contact region often occur due to misalignment. Thus a need exists to protect the buried contact from exposure and trenching during gate patterning. In one solution a buried contact cap is used to protect the buried contact region. However a parasitic transistor is formed around the contact cap thereby degrading the performance of the device. In one solution an implant mask has been added to lower contact resistance and eliminate parasitic transistor problems.

Thus a need exits for a method having minimal contamination when forming a polycrystalline silicon interconnect which has integrity within the contact without reflective notching. The method must also retain a conformal gate oxide layer without trenching or exposing the substrate.

SUMMARY OF THE INVENTION

The invention is a method for forming an electrical interconnect, typically of polycrystalline silicon (although amorphous silicon or other electrically conductive materials may be used), overlying a buried contact region of a substrate. A first electrically conductive layer, typically of polycrystalline silicon (poly 1), is deposited to overlie the substrate. The poly 1 is patterned and etched to form a via thereby exposing the substrate. A second electrically conductive layer, typically of polycrystalline silicon (poly 2), is deposited to overlie the substrate and the poly 1 layer. In a first embodiment the poly 2 layer is chemically mechanically planarized to remove the poly 2 layer overlying the poly 1 layer thereby eliminating a horizontal interface between the poly 1 and the poly 2 layers.

In a second embodiment a layer resistant to a polycrystalline silicon etch is created prior to the patterning and etch of the poly 1 layer and prior to the deposition of the poly 2 layer. This layer will be referred to as a first polycrystalline silicon etch stop layer or just first etch stop layer. The first etch stop layer is patterned and etched to expose the poly 1 in the buried contact region. The poly 1 layer is then etched to expose the buried contact region of the substrate and poly 2 is deposited to overlie the remaining first etch stop layer and buried contact region. The poly 2 is then removed to expose the etch stop layer. Poly 2 remains in the via.

At this juncture a layer which is capable of reacting with silicon to form a silicon etch stop layer is deposited to overlie the first etch stop layer and the second polycrystalline silicon layer. A reaction is created between the second polycrystalline silicon layer and the layer which is capable of reacting with silicon, typically titanium. A second etch stop layer, resistant to a polycrystalline silicon etch, is formed overlying the poly 2 layer as a result of the reaction. The first etch stop layer functions as a protective layer during the reaction to prohibit a reaction between the poly 1 layer and the layer which is capable of reacting with silicon. The second etch stop layer eliminates trenching and exposure of the substrate even with gross misalignment of the photoresist mask during an etch of the poly 1 to form the interconnect.

In a further embodiment the invention is a semiconductor interconnect for electrically connecting a first region of a substrate and a second region of the substrate. The semiconductor interconnect comprises an electrically conductive silicon plug overlying and in electrical contact with the first region and the second region and an electrically conductive silicon layer, without a silicon interface horizontal to the substrate. The electrically conductive silicon layer is electrically isolated from the substrate and interposed between the silicon plug overlying the first region and the silicon plug overlying the second region. The interface between the silicon plug overlying the first region and the silicon layer is vertical to the substrate as is the interface between the silicon plug overlying the second region and the silicon layer.

BRIEF DESCRIPTION OF THE DRAWING

FIGS. 2–12 depict the steps of the invention in cross section.

In FIG. 8 a titanium layer has been deposited to overlie the etch stop layer and second polycrystalline silicon layer of FIG. 5B.

In FIG. 9 an etch stop layer is formed overlying the second polycrystalline silicon layer and the titanium is removed.

In FIG. 10 the etch stop layer of FIG. 2B is removed.

In FIG. 11 a gate region is patterned and the first polycrystalline silicon layer is removed in unmasked regions.

In FIG. 12 the pattern has been removed.

DETAILED DESCRIPTION OF THE INVENTION

The invention is a method for forming an electrical interconnect of polycrystalline silicon overlying a buried contact region of a substrate. The method is depicted in cross section in FIGS. 2–12.

Figure 2A:
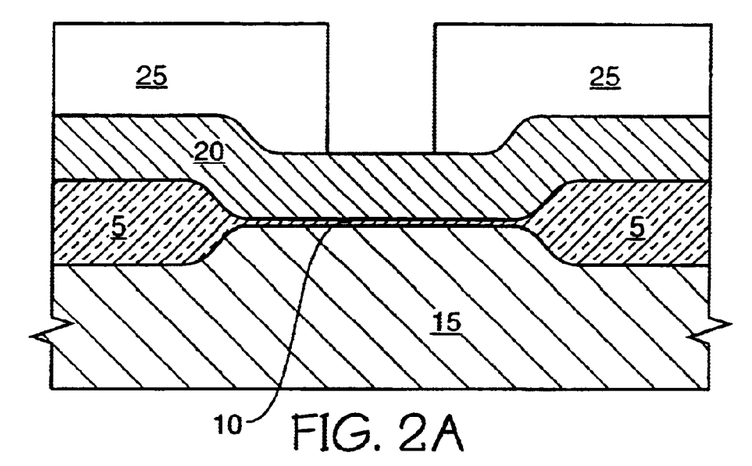
In FIG. 2A a first polycrystalline silicon layer has been deposited to overlie a substrate and has been patterned to define a buried contact region.
Figure 2B:
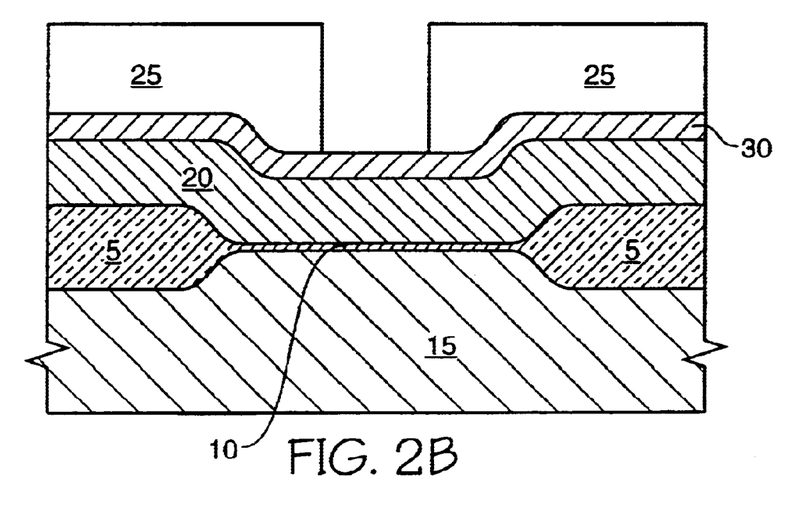
In FIG. 2B a first polycrystalline silicon layer and an etch stop layer have been deposited to overlie a substrate and have been patterned to define a buried contact region.

In the embodiments shown in FIGS. 2A and 2B field oxide regions 5 and a gate oxide layer 10 are formed by conventional methods to overlie a substrate 15. A first polycrystalline silicon layer 20 (poly 1) is deposited to overlie the field oxide regions 5 and gate oxide 10. The thickness of the first polycrystalline silicon layer 20 is selected such that the lowest upper surface of the first polycrystalline silicon layer 20 is higher than the highest upper surface of the field oxide regions 5. The polycrystalline silicon layer 20 is then patterned with photoresist mask 25.

In the second embodiment, shown in FIG. 2B, a polycrystalline silicon etch stop layer 30, also referred to as just etch stop layer 30, is deposited to overlie the first polycrystalline silicon layer 20 prior to patterning with photoresist mask 25. The etch stop layer is irresponsive to a polycrystalline silicon etch. In this embodiment the etch stop layer is oxide although nitride or some other material may also be used.

Figure 3A:
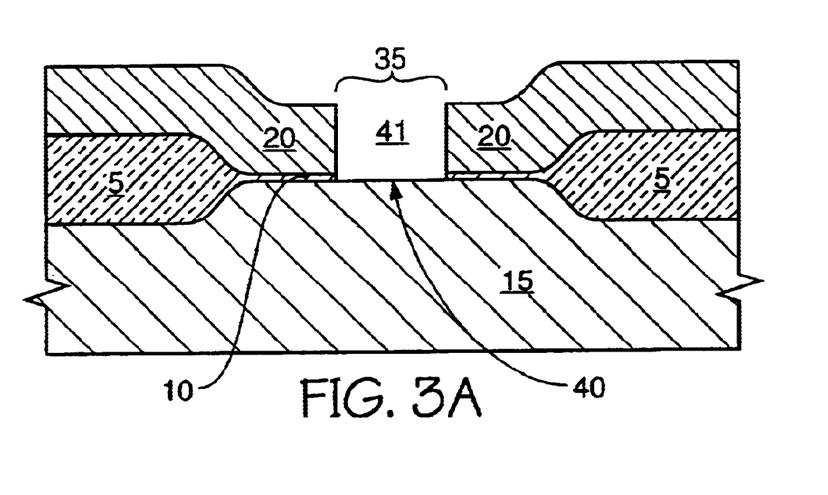
In FIGS. 3A and 3B the substrate has been exposed.
Figure 3B:
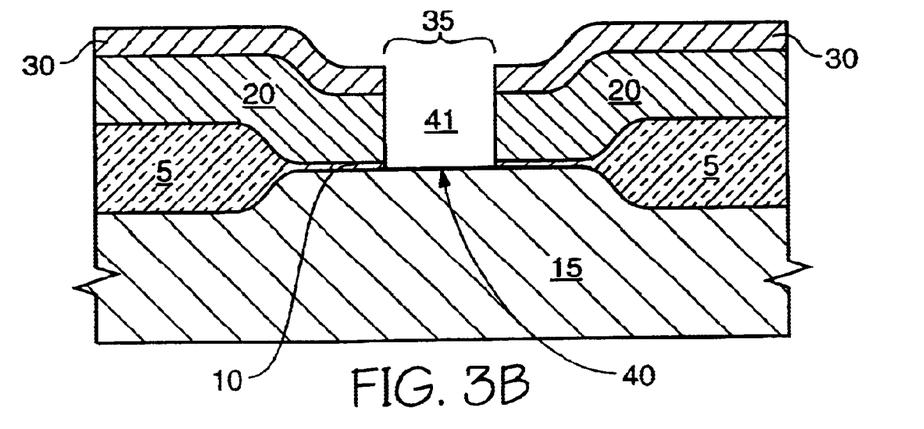

Next the first polycrystalline silicon layer 20 and the gate oxide layer 10 are etched by conventional methods in unmasked region 35 to exposed the buried contact portion 40 of the substrate 15, thereby forming a via 41. This is shown in FIGS. 3A and 3B for the first and the second embodiments respectively. In the second embodiment, see FIG. 3B, a separate etch is conducted prior to the polycrystalline silicon etch to remove the etch stop layer 30 in the unmasked region 35. Subsequent to the formation of via 41 the photoresist mask 25 are removed.

Figure 4A:
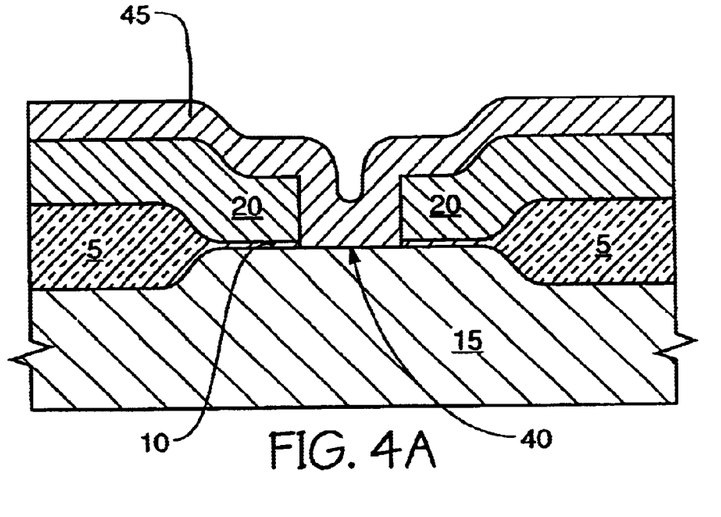
In FIGS. 4A and 4B a second polycrystalline silicon layer has been deposited.
Figure 4B:
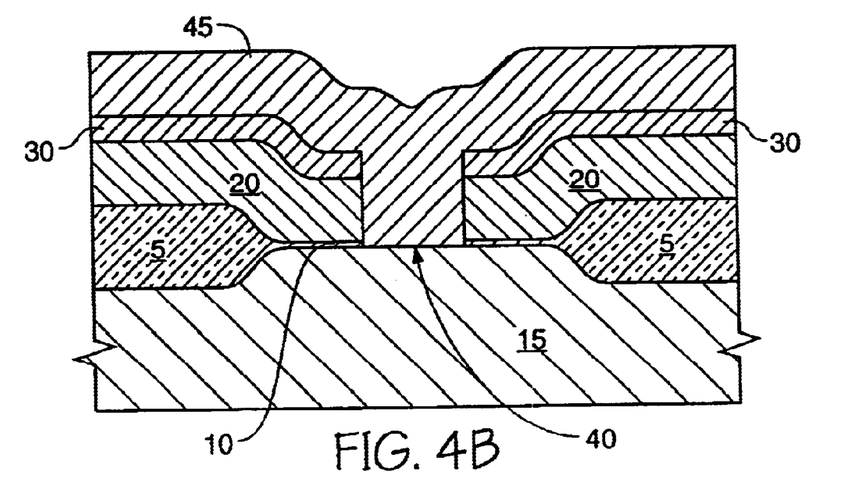

In FIGS. 4A and 4B of the first and second embodiments a second polycrystalline silicon layer 45 (poly 2) is deposited to overlie the first polycrystalline silicon layer 20 and the buried contact portion 40. In the second embodiment the second polycrystalline silicon layer 45 also overlies the etch stop layer 30 and must be thick enough to fill the via 41.

Figure 5A:
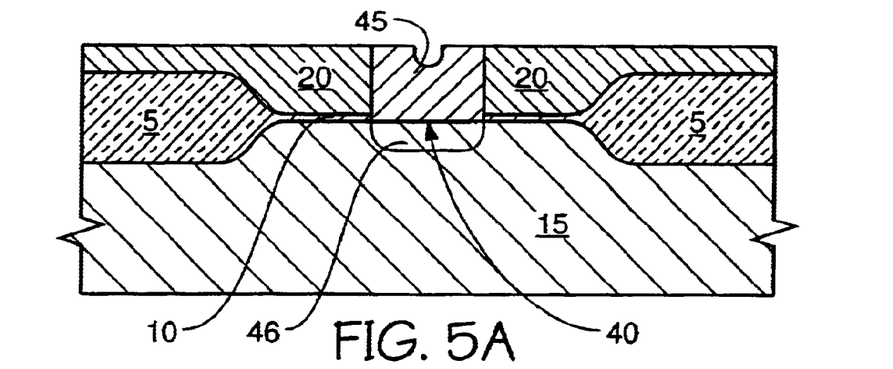
In FIGS. 5A and 5B the second polycrystalline silicon layer has been removed in areas overlying the first polycrystalline silicon layer.

In,the first embodiment, see FIG. 5A, a chemical mechanical planarization removes the second polycrystalline silicon 45 overlying the first polycrystalline silicon layer 20 to expose the first polycrystalline silicon layer 20 thereby eliminating a poly 1 and poly 2 horizontal interface. It can be seen that the height of the first polycrystalline layer 20 defines the height of the second polycrystalline silicon layer 45 after the planarization. There may be some loss of the original height of the first polycrystalline silicon layer 20 due to a loss during the chemical mechanical planarization, but it is typically negligible.

Figure 5B:
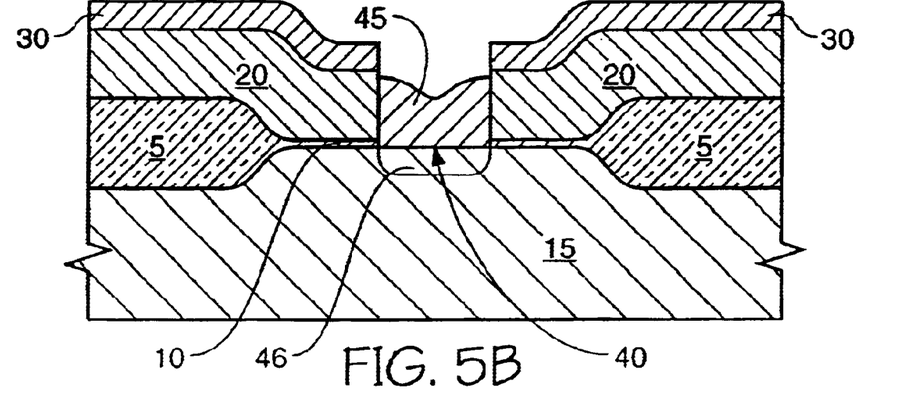

In the second embodiment, see FIG. 5B a polycrystalline silicon etch is used to remove the poly 2 layer 45 overlying the poly 1 layer 20 and etch stop layer 30. In this case it can be seen that the total height of the poly 1 layer 20 and the etch stop layer 30 defines the maximum height of the poly 2 layer 45 after the etch. However, the etch typically consumes additional portions of poly 2 layer 45 such that the upper portion of the poly 2 layer 45 is below the surface of the etch stop layer 30. After removal of the poly 2 layer 45 overlying the poly 1 layer 20 the second polycrystalline silicon layer 45 remaining in via 41 forms a contact plug in electrical contact with buried contact portion 40.

In all of the embodiments the first and second polycrystalline silicon layers are doped to increase conductivity. The preferred doping comprises implanting arsenic and then performing an anneal to diffuse the arsenic. A doped region 46 is created in the buried contact portion 40 of the substrate by diffusion or other means. The doped region 46 typically contacts other diffusion regions in the substrate which are not shown in the present figures but which are well known to those skilled in the art. The exact point or points in the process where doping is performed is subject to manufacturing considerations and is therefore determined at the time of manufacture by a person skilled in the art.

At this junction the method may proceed along two alternate paths to form the contact plug of the invention. FIGS. 6 and 7 represent the first path and FIGS. 8–12 represent the second path.

Figure 6A:
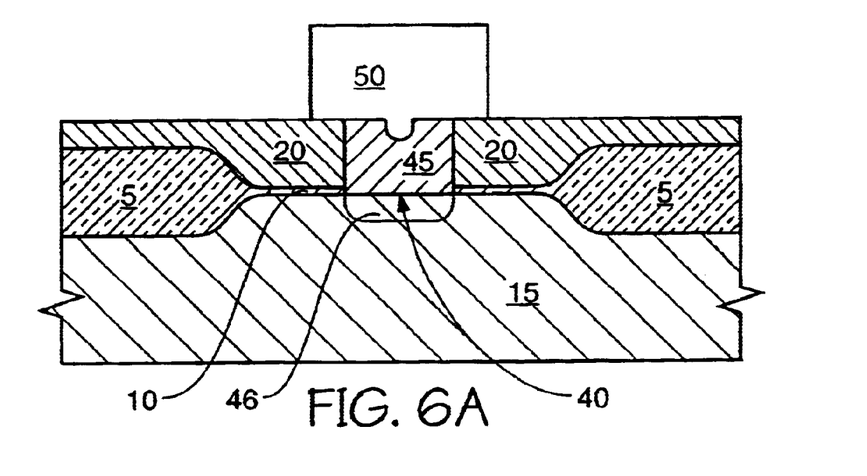
In FIGS. 6A and 6B a gate region has been patterned.
Figure 6B:
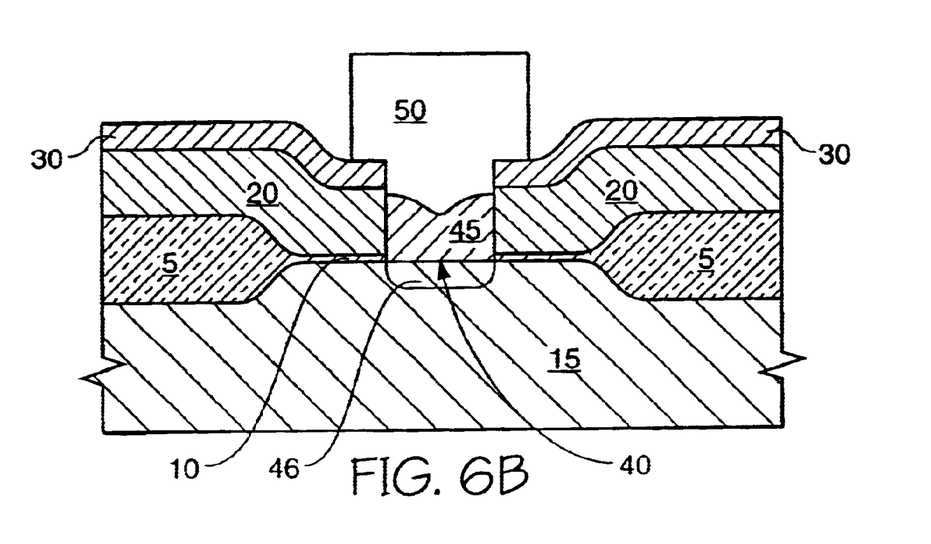

In FIGS. 6A and 6B the first polycrystalline silicon layer 20 is patterned with a photoresist mask 50 to define an electrical interconnect comprising the contact plug of polycrystalline silicon layer 45 and the first polycrystalline silicon layer 20. The electrical interconnect may have different functions and is patterned according to the function desired. In addition to providing electrical access to the buried contact portion 40 the contact plug may form a gate for a field effect transistor or may provide electrical contact to further circuit components. If the photoresist mask 50 is designed to overlap the upper surface of the second poly 2 layer 45 the trenching and exposure of the substrate is eliminated during the etch of the poly 1 layer 20. An optional oxide layer may be deposited to overlie the poly 1 and poly 2 layers 20 and 45 prior to the masking.

Figure 7A:
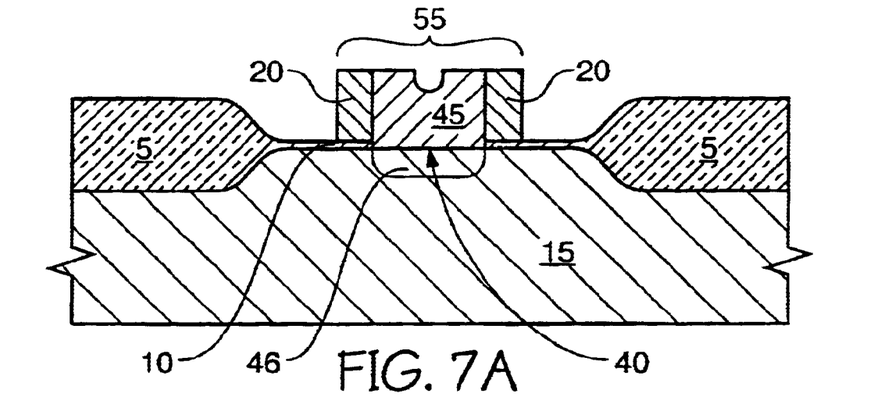
In FIGS. 7A and 7B the first polycrystalline silicon layer has been etched to form the gate region.
Figure 7B:
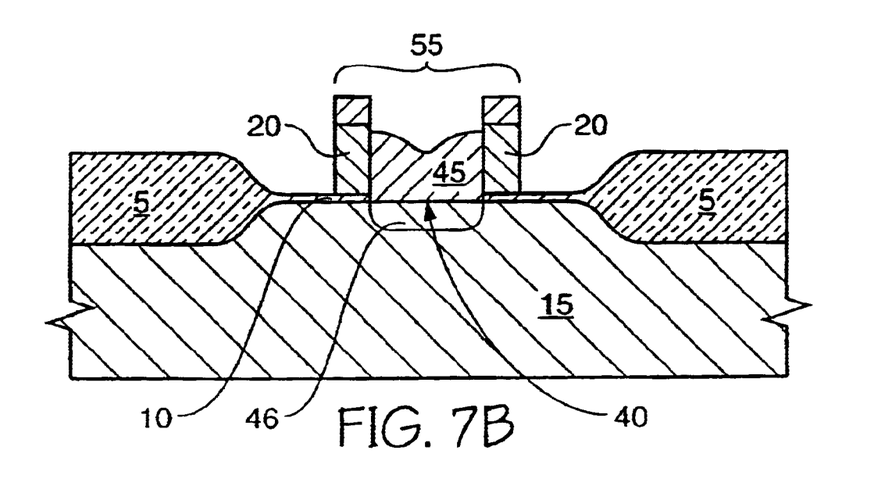

The poly 2 layer 20, and the optional oxide layer when deposited, in FIG. 6A and etch stop layer 30 in FIG. 6B are then etched in exposed areas. The photoresist mask 50 is then removed to form the electrical interconnect 55 comprising the contact plug and polycrystalline silicon layer 20 as shown in FIGS. 7A and 7B for the first and second embodiments, respectively.

Figure 8:
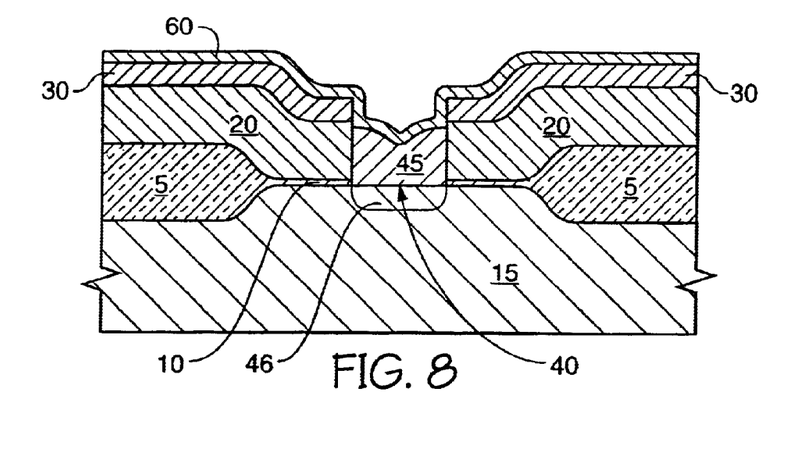
Figure 9:
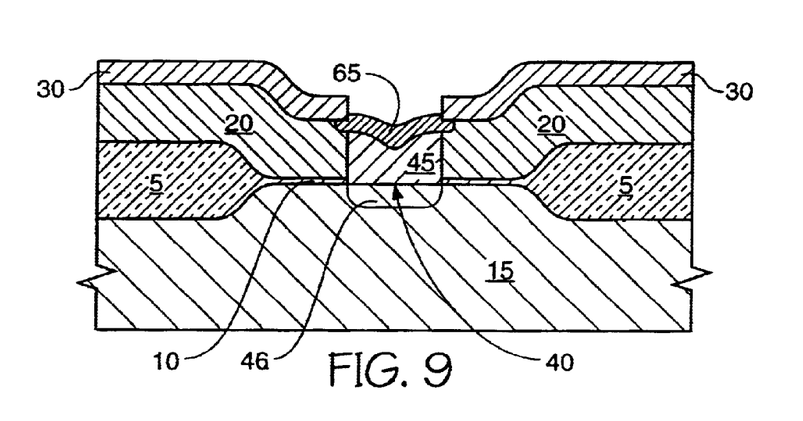

In the second path a titanium layer 60 is deposited to overlie the etch stop layer 30 and the poly 2 layer 45 of FIG. 6B, see FIG. 8.

Next the structure is heated to a temperature conducive to forming titanium silicide. The poly 2 layer 45 reacts with the titanium during heating to form titanium silicide which functions as a silicon etch stop layer 65, see FIG. 9. The nonreacted titanium 60 overlying the etch stop layer 30 is removed following the formation of the titanium silicide 65, also see FIG. 9. The etch stop layer 30 functions as a protective layer prohibiting a reaction between the titanium layer 60 and the poly 1 layer 20 during the reaction of the poly 2 layer 45 with the titanium layer 60.

Optionally, in place of a titanium deposit 60 and subsequent formation of etch stop layer 65 of titanium silicide, oxide may be grown overlying poly 2 layer 45 during an anneal. The result is similar to the structure shown in FIG. 9. However in this case the etch stop layer 30 is nitride and the etch stop layer 65 is oxide.

Figure 10:
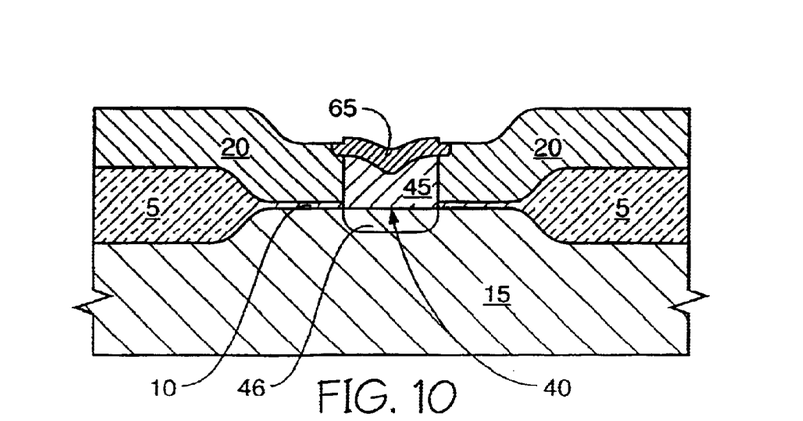

In either case, the etch stop layer 30 may be removed subsequent to the formation of etch stop layer 65, see FIG. 10.

Figure 11:
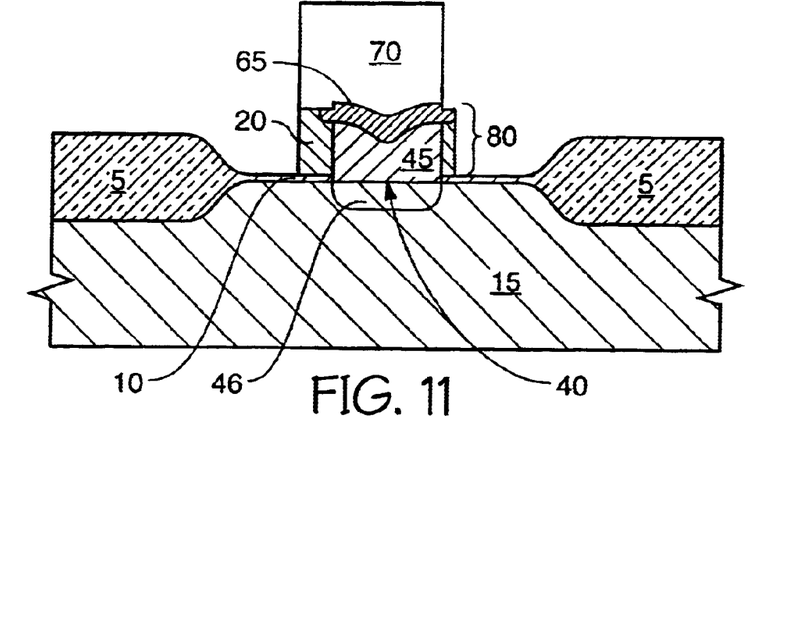

The electrical interconnect is patterned with photoresist mask 70 in FIG. 11.

The poly 1 layer 20, and etch stop layer 30 if not already removed, is removed in exposed regions. Since silicon is selectively etchable over the etch stop layer 65 trenching and exposure of the substrate are eliminated during the etch of the poly 1 layer 20 due to the protection afforded the substrate by the etch stop layer 65, either titanium silicide or oxide, during the etch. The etch stop layer 65 is used during the formation of the electrical interconnect 80 to protect the second polycrystalline silicon 45 during the formation of the electrical interconnect 80. The polycrystalline silicon etch is highly selective over titanium silicide or oxide. By using this path of the second embodiment it is possible to eliminate trenching and exposure of the substrate even with gross misalignment of the photoresist mask.

Figure 12:
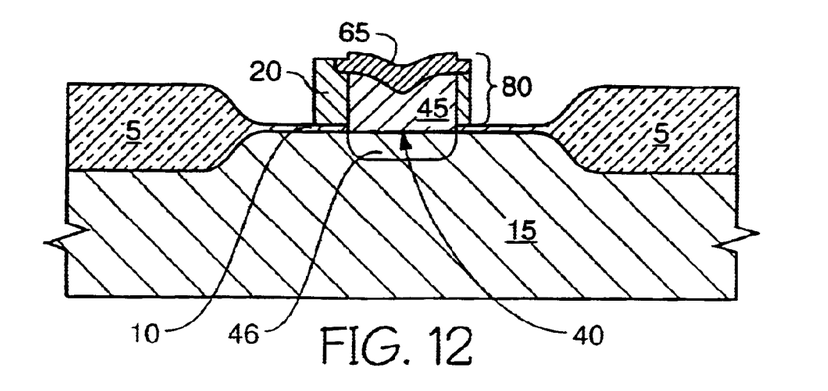

The electrical interconnect 80 and contact plug formed from poly 2 layer 45 are shown following the removal of the photoresist mask 70. Since it was not necessary to use a contact cap to form the interconnect 80 parasitic transistor formation is eliminated. In addition cell size is reduced over methods using a contact cap.

The electrical interconnect formed by the method of the invention may be used in the manufacture of static random access memories (SRAMs) as well as dynamic random access memories.

Although the present invention has been described with reference to particular embodiments, other versions are possible and will be apparent to individuals skilled in the art. The invention therefore, is not limited to the specific features and elements shown. It is intended that the scope of the invention be defined by the appended claims and in accordance with the doctrine of equivalents.

What is claimed is:

1. A method for forming an electrical interconnection on a semiconductor wafer, comprising:
    forming an insulating layer on a substrate of the wafer;
    forming a first conductive layer of material on the insulating layer;
    forming a via through the first conductive layer and the insulating layer;
    depositing a second conductive layer of material over both the first conductive layer and the via such that the second conductive layer contacts the substrate in the via;
    removing that portion of the second conductive layer overlying the first conductive layer, so as to leave a plug of the material of the second conductive layer in the via, the plug having only vertical interfaces with the first conductive layer; and
    removing the first conductive layer from the region remote from the plug of material of the second conductive layer to leave a projecting electrical interconnection plug having a core of the material of the second conductive layer and a surrounding wall of material of the first conductive layer.

2. The method of claim 1 where the material of the first conductive layer is polysilicon.

3. The method of claim 1 where the material of the second conductive layer is polysilicon.

4. The method of claim 1 where forming the via comprises etching the first conductive layer and the insulating layer in the location of the via.

5. The method of claim 4 where forming the via further comprises patterning the first conductive layer so as to define the location of the via.

6. The method of claim 1 where the second conductive layer is deposited so as to contact the first conductive layer and not the substrate in an area of the wafer surrounding the via.

7. The method of claim 1 where the insulating layer is an oxide of silicon.

8. The method of claim 1 where the insulating layer has a thinner gate region surrounding the via and a thicker field region surrounding the gate region.

9. The method of claim 8 where the second conductive layer is deposited so that its upper surface is higher than the upper surface of the insulating layer in the field region.

10. The method of claim 1 where removing the second conductive layer portion removes all horizontal interfaces between the first conductive layer and the second conductive layer.

11. The method of claim 1 where removing the second conductive layer portion comprises reducing the height of the second conductive layer portion above the substrate.

12. The method of claim 11 where reducing the height of the second conductive layer portion removes all of the second conductive layer except for the plug in the via.

13. The method of claim 12 where the height of the plug is the same as the height of the first conductive layer of material.

14. The method of claim 11 where reducing the height of the second conductive layer comprises planarizing the semiconductor wafer.

15. The method of claim 11 where reducing the height of the second conductive layer comprises chemical mechanical polishing the semiconductor wafer.

16. The method of claim 1 where removing the portion of the first conductive layer comprises:
    masking the area surrounding the via; and
    etching the first conductive layer.

17. The method of claim 16 where the entire height of the first conductive layer is etched in the area surrounding the via.

18. A method for forming an electrical interconnection on a semiconductor wafer, comprising:
    forming an insulating layer on a substrate of the wafer;
    forming on the insulating layer a first layer of a conductive material;
    forming a via through the first layer of conductive material and the insulating layer;
    depositing a second layer of conductive material over both the first layer and the via such that the second conductive layer contacts the substrate in the via, said second layer of conductive material comprising silicon;
    removing that portion of the second conductive layer overlying the first layer, so as to leave a plug of the second conductive material in the via, the plug having only vertical interfaces with the first conductive layer; and
    removing the first conductive layer from the region remote from the plug of material of the second conductive layer to leave a projecting electrical interconnection plug having a core of the material of the second conductive layer and a surrounding wall of material of the first conductive layer.

19. The method of claim 18 where the conductive material of the first layer comprises silicon.

20. A method for forming an electrical interconnection on a semiconductor wafer, comprising:
    forming an insulating layer on a substrate of the wafer;
    forming a first conductive layer of material on the insulating layer;
    patterning the first conductive layer so as to define a location for a via;

etching the first conductive layer and the insulating layer to form the via;

depositing a second conductive layer of material over both the first layer and the via such that the second conductive layer contacts the substrate in the via;

removing that portion of the second conductive layer overlying the first conductive layer, so as to leave a plug of material of the second conductive layer in the via, the plug having only vertical interfaces with the material of the first conductive layer; and removing the first conductive layer from the region remote from the plug of material of the second conductive layer to leave a projecting electrical interconnection plug having a core of the material of the second conductive layer and a surrounding wall of material of the first conductive layer.

21. A method for forming an electrical interconnection on a semiconductor wafer, comprising:

forming an insulating layer on a substrate of the wafer, the insulating layer having a thin gate region surrounded by a thicker field region;

forming a first conductive layer of material on the insulating layer;

forming a via through the first conductive layer and the insulating layer;

depositing a second conductive layer of material over both the first conductive layer and the via such that the second conductive layer contacts the substrate in the via and such that the plane of the upper surface of the second conductive layer higher than the height of the surface of the insulating layer in the field region;

removing the entirety of that portion of the second conductive layer overlying the first conductive layer, so as to leave a plug of the material of the second conductive layer in the via, the plug having only vertical interfaces with the first conductive layer.

22. The method of claim 21 where removing the second conductive layer portion comprises planarizing the semiconductor wafer.

23. A method for forming an electrical interconnection on a semiconductor wafer, comprising:

forming an insulating layer on a substrate of the wafer;

forming a first conductive layer of material on the insulating layer;

forming a via through the first conductive layer and the insulating layer;

depositing a second conductive layer of material over both the first conductive layer and the via such that the second conductive layer contacts the substrate in the via;

removing all the second conductive layer, so as to leave only a plug of the material of the second conductive layer in the via, the plug having only vertical interfaces with the first conductive layer; and removing the first conductive layer from the region remote from the plug of material of the second conductive layer to leave a projecting electrical interconnection plug having a core of the material of the second conductive layer and a surrounding wall of material of the first conductive layer.

24. A method for forming an electrical interconnection on a semiconductor wafer, comprising:

forming an insulating layer on a substrate of the wafer;

forming a first conductive layer of material on the insulating layer;

forming a via through the first conductive layer and the insulating layer;

depositing a second conductive layer of material over both the first conductive layer and the via such that the second conductive layer contacts the substrate in the via;

reducing the thickness of that portion of the second conductive layer overlying the first conductive layer to remove all of the second conductive layer so as to leave a plug of the material of the second conductive layer only in the via, the plug having only vertical interfaces with the first conductive layer; and removing the first conductive layer from the region remote from the plug of material of the second conductive layer to leave a projecting electrical interconnection plug having a core of the material of the second conductive layer and a surrounding wall of material of the first conductive layer.

25. A method for forming an electrical interconnection on a semiconductor wafer, comprising:

forming an insulating layer on a substrate of the wafer;

forming a first conductive layer of material on the insulating layer;

forming a via through the first conductive layer and the insulating layer;

depositing a second conductive layer of material over both the first conductive layer and the via such that the second conductive layer contacts the substrate in the via; and removing that portion of the second conductive layer outside an area surrounding the via and overlying the first conductive layer, so as to leave a plug of the material of the second conductive layer in the via, the portion of the plug above the via surrounded by the material of the second conductive layer within the area surrounding the via, the plug having only vertical interfaces with the first conductive layer; and removing the first conductive layer from the region remote from the plug of material of the second conductive layer to leave a projecting electrical interconnection plug having a core of the material of the second conductive layer and a surrounding wall of material of the first conductive layer.

26. A method for forming an electrical interconnection on a semiconductor wafer, comprising:

forming an insulating layer on a substrate of the wafer;

forming a first conductive layer of material on the insulating layer;

forming a via through the first conductive layer and the insulating layer;

depositing a second conductive layer of material over both the first conductive layer and the via such that the second conductive layer contacts the substrate in the via; and masking the area surrounding the via; and etching the first layer so as to leave a plug of the material of the second conductive layer in the via, the plug having only vertical interfaces with the first conductive layer; and removing the first conductive layer from the region remote from the plug of material of the second conductive layer to leave a projecting electrical interconnection plug having a core of the material of the second conductive layer and a surrounding wall of material of the first conductive layer.

27. A method for forming an electrical interconnect, comprising:
- creating a first electrically conductive layer overlying a substrate;
- patterning said first electrically conductive layer to create a masked region and an unmasked region;
- exposing the substrate in said unmasked region, thereby forming a via in said first electrically conductive layer;
- creating a second electrically conductive layer to overlie said first electrically conductive layer and the substrate, said second electrically conductive layer electrically contacting the substrate beneath the via; and
- removing said second electrically conductive layer from overlying said first electrically conductive layer, a portion of said second electrically conductive layer remaining in the via as an electrical plug, the electrical plug and the remainder of the first electrically conductive layer forming the electrical interconnect, the electrical plug and the first electrically conductive layer having only vertical interfaces; and
- removing the first conductive layer from the region remote from the plug of material of the second conductive layer to leave a projecting electrical interconnection plug having a core of the material of the second conductive layer and a surrounding wall of material of the first conductive layer.

28. A method for forming an electrical interconnect, comprising:
- creating a first electrically conductive layer overlying a substrate;
- patterning said first electrically conductive layer to create a masked region and an unmasked region;
- exposing the substrate in said unmasked region, thereby forming a via having a sidewall comprising said first electrically conductive layer;
- creating a second electrically conductive layer to overlie said first electrically conductive layer and the substrate, said second electrically conductive layer electrically contacting the substrate below the via; and
- etching a portion of said second electrically conductive layer to expose said first electrically conductive layer, at least a portion of said second electrically conductive layer remaining in electrical contact with the substrate to form an electrical plug of the electrical interconnect, the plug having only vertical interfaces with the first electrically conducting layer; and
- removing the first conductive layer from the region remote from the plug of material of the second conductive layer to leave a projecting electrical interconnection plug having a core of the material of the second conductive layer and a surrounding wall of material of the first conductive layer.

29. A method for forming an electrical interconnection on a semiconductor wafer, comprising:
- forming an insulating layer on a substrate of the wafer;
- forming a first conductive layer of material on the insulating layer;
- forming a via through the first conductive layer and the insulating layer;
- depositing a second conductive layer of the material over both the first conductive layer and the via such that the second conductive layer contacts the substrate in the via;
- removing all the second conductive layer, so as to leave only a plug of the material in the via, the plug having only vertical interfaces with the first conductive layer; and
- removing the first conductive layer from the region remote from the plug of material of the second conductive layer to leave a projecting electrical interconnection plug having a core of the material and a surrounding wall of material of the first conductive layer.

30. The method of claim 29 wherein the material of the first and second conductive layers is polysilicon.

31. A method for forming an electrical interconnect on a semiconductor wafer, comprising:
- forming an insulating layer on a substrate of the wafer;
- forming a first conductive layer of material on the insulating layer;
- forming a via through the first conductive layer and the insulating layer;
- depositing a second conductive layer of the material over both the first conductive layer and the via such that the second conductive layer contacts the substrate in the via;
- reducing the thickness of that portion of the second conductive layer overlying the first conductive layer to remove all of the second conductive layer so as to leave a plug of the second conductive layer only in the via, the plug having only vertical interfaces with the first conductive layer; and
- removing the first conductive layer from the region remote from the plug of the second conductive layer to leave a projecting electrical interconnect plug having a core of the second conductive layer and a surrounding wall of the first conductive layer.

32. The method of claim 31 wherein the material of the first and second conductive layers is polysilicon.

33. A method for forming an electrical interconnect on a semiconductor wafer, comprising:
- forming an insulating layer on a substrate of the wafer;
- forming a first conductive layer of material on the insulating layer;
- forming a via through the first conductive layer and the insulating layer;
- depositing a second conductive layer of material over both the first conductive layer and the via such that the second conductive layer contacts the substrate in the via; and
- removing that portion of the second conductive layer outside an area surrounding the via and overlying the first conductive layer, so as to leave a plug of the material of the second conductive layer in the via, the portion of the plug above the via surrounded by the material of the second conductive layer within the area surrounding the via, the plug having only vertical interfaces with the first conductive layer; and
- removing the first conductive layer from the region remote from the plug of material of the second conductive layer to leave a projecting electrical interconnect plug having a core of the material of the second conductive layer and a surrounding wall of material of the first conductive layer.

34. The method of claim 33 wherein the material of the first and second conductive layers is polysilicon.

35. A method for forming an electrical interconnect on a semiconductor wafer, comprising:
- forming an insulating layer on a substrate of the wafer;
- forming a first conductive layer of material on the insulating layer;
- forming a via through the first conductive layer and the insulating layer;

depositing a second conductive layer of polysilicon over both the first conductive layer and the via such that the second conductive layer contacts the substrate in the via;

removing that portion of the second conductive layer overlying the first conductive layer, so as to leave a plug of the material of the second conductive layer in the via, the plug having only vertical interfaces with the first conductive layer; and removing the first conductive layer from the region remote from the plug of polysilicon material to leave a projecting electrical interconnect plug having a core of the polysilicon of the second conductive layer and a surrounding wall of material of the first conductive layer.

36. The method of claim 35 where the material of the first conductive layer is polysilicon.

37. The method of claim 35 where forming the via comprises etching the first conductive layer and the insulating layer in the location of the via.

38. The method of claim 37 where forming the via further comprises patterning the first conductive layer so as to define the location of the via.

39. The method of claim 35 where the second conductive layer is deposited so as to contact the first conductive layer and not the substrate in an area of the wafer surrounding the via.

40. The method of claim 35 where the insulating layer is an oxide of silicon.

41. The method of claim 35 where the insulating layer has a thinner gate region surrounding the via and a thicker field region surrounding the gate region.

42. The method of claim 41 where the second conductive layer is deposited so that its upper surface is higher than the upper surface of the insulating layer in the field region.

43. The method of claim 35 where removing the second conductive layer portion removes all horizontal interfaces between the first conductive layer and the second conductive layer.

44. The method of claim 35 where removing the second conductive layer portion comprises reducing the height of the second conductive layer portion above the substrate.

45. The method of claim 44 where reducing the height of the second conductive layer portion removes all of the second conductive layer except for the plug in the via.

46. The method of claim 45 where the height of the plug is the same as the height of the first conductive layer of material.

47. The method of claim 44 where reducing the height of the second conductive layer comprises planarizing the semiconductor wafer.

48. The method of claim 44 where reducing the height of the second conductive layer comprises chemical mechanical polishing the semiconductor wafer.

49. The method of claim 35 where removing the portion of the first conductive layer comprises:

masking the area surrounding the via; and etching the first conductive layer.

50. The method of claim 49 where the entire height of the first conductive layer is etched in the area surrounding the via.

* * * * *